US012666585B2

(12) United States Patent
Yu et al.

(10) Patent No.: US 12,666,585 B2
(45) Date of Patent: Jun. 23, 2026

(54) SEMICONDUCTOR DEVICE

(71) Applicant: Taiwan Semiconductor Manufacturing Company, Ltd., Hsinchu (TW)

(72) Inventors: Dian-Sheng Yu, Hsinchu (TW); Jhon-Jhy Liaw, Hsinchu (TW); Kuo-Hua Pan, Hsinchu (TW); Chia-He Chung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 367 days.

(21) Appl. No.: 18/224,810

(22) Filed: Jul. 21, 2023

(65) Prior Publication Data

US 2025/0031358 A1     Jan. 23, 2025

(51) Int. Cl.
H10B 10/00          (2023.01)
(52) U.S. Cl.
CPC .................................... H10B 10/12 (2023.02)
(58) Field of Classification Search
CPC ..................................................... H10B 10/12
See application file for complete search history.

(56) References Cited

U.S. PATENT DOCUMENTS

| | | | |
|---|---|---|---|
| 2006/0131614 A1* | 6/2006 | Liaw ...................... | H10B 10/00 |
| | | | 257/E27.099 |
| 2014/0035056 A1* | 2/2014 | Liaw ..................... | G11C 11/412 |
| | | | 257/E27.098 |

* cited by examiner

*Primary Examiner* — Allison Bernstein
(74) *Attorney, Agent, or Firm* — Birch, Stewart, Kolasch & Birch, LLP

(57)          ABSTRACT

A semiconductor device is provided. The semiconductor device includes a first pull-down transistor, a first pull-up transistor, a second pull-down transistor, a second pull-up transistor, a first pass gate transistor, a second pass gate transistor, a first bit line, a second bit line, a word line and a voltage supply line. The first pull-down transistor and the first pull-up transistor form a first inverter. The second pull-down transistor and the second pull-up transistor form a second inverter. An input of the first inverter is connected to an output of the second inverter through a first node butted contact. The first node butted contact includes a metal contact directly contacted a gate of the first pull-down transistor and the first pull-up transistor and directly contacted a source/drain of the second pull-down transistor, the second pull-up transistor and the second pass gate transistor.

20 Claims, 9 Drawing Sheets

100

SEMICONDUCTOR DEVICE

BACKGROUND

As the scaling of the semiconductor technology is advanced, the spaces among the metal lines or the width of each of the metal lines must be decreased. To avoid photo-resist dumping, the spaces among the metal lines cannot be reduced too much, so the width of each of the metal lines must be decreased.

However, the resistivity of the metal line is increased when the width of each of the metal lines is decreased.

Moreover, because the pitch is lessened, the isolation between a node butted contact and the metal lines becomes harder to control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
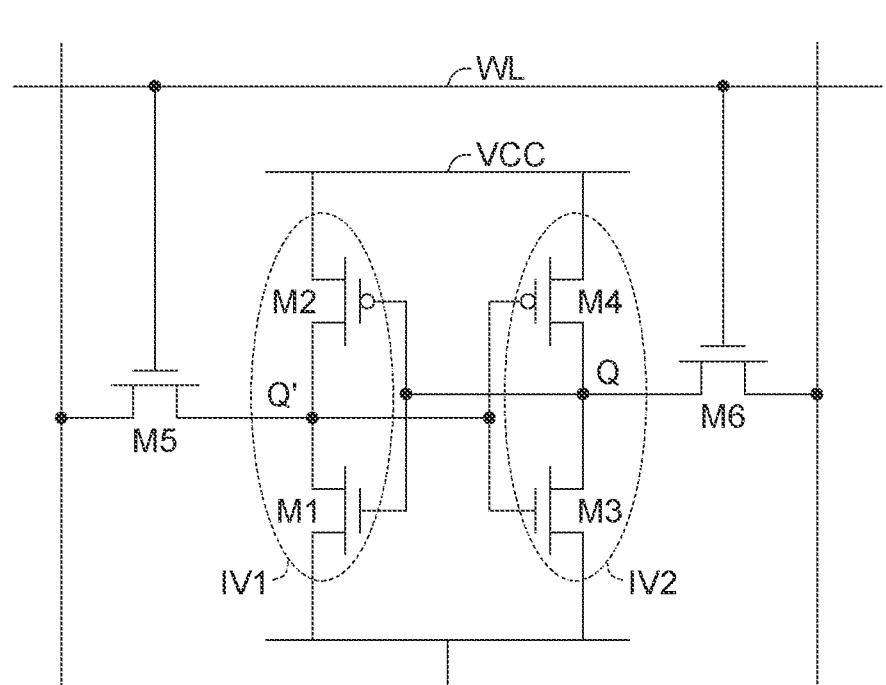
FIG. 1 shows a semiconductor device according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a semiconductor device 100 according to one embodiment. The semiconductor device 100 is exemplified as a static random-access memory (SRAM) cell. As shown in FIG. 1, the semiconductor device 100 is a 6 T-SRAM cell which includes a pull-down transistor M1, a pull-up transistor M2, a pull-down transistor M3, a pull-up transistor M4, a pass gate transistor M5, a pass gate transistor M6, a bit line BL, a bit line BL', a word line WL and a voltage supply line VCC. The pull-down transistor M1 and the pull-up transistor M2 form an inverter IV1, the pull-down transistor M3 and the pull-up transistor M4 form another inverter IV2. An output of the inverter IV1 is connected to an input of the inverter IV2, and an input of the inverter IV1 is connected to an output of the inverter IV2, as such a latch is formed. Data is kept in this latch. For example, when data "0" is stored in the semiconductor device 100, a node butted contact Q' is kept at a low voltage and a node butted contact Q is kept at a high voltage; when data "1" is stored in the semiconductor device 100, the node butted contact Q' is kept at the high voltage and the node butted contact Q is kept at the low voltage.

Figure 2:
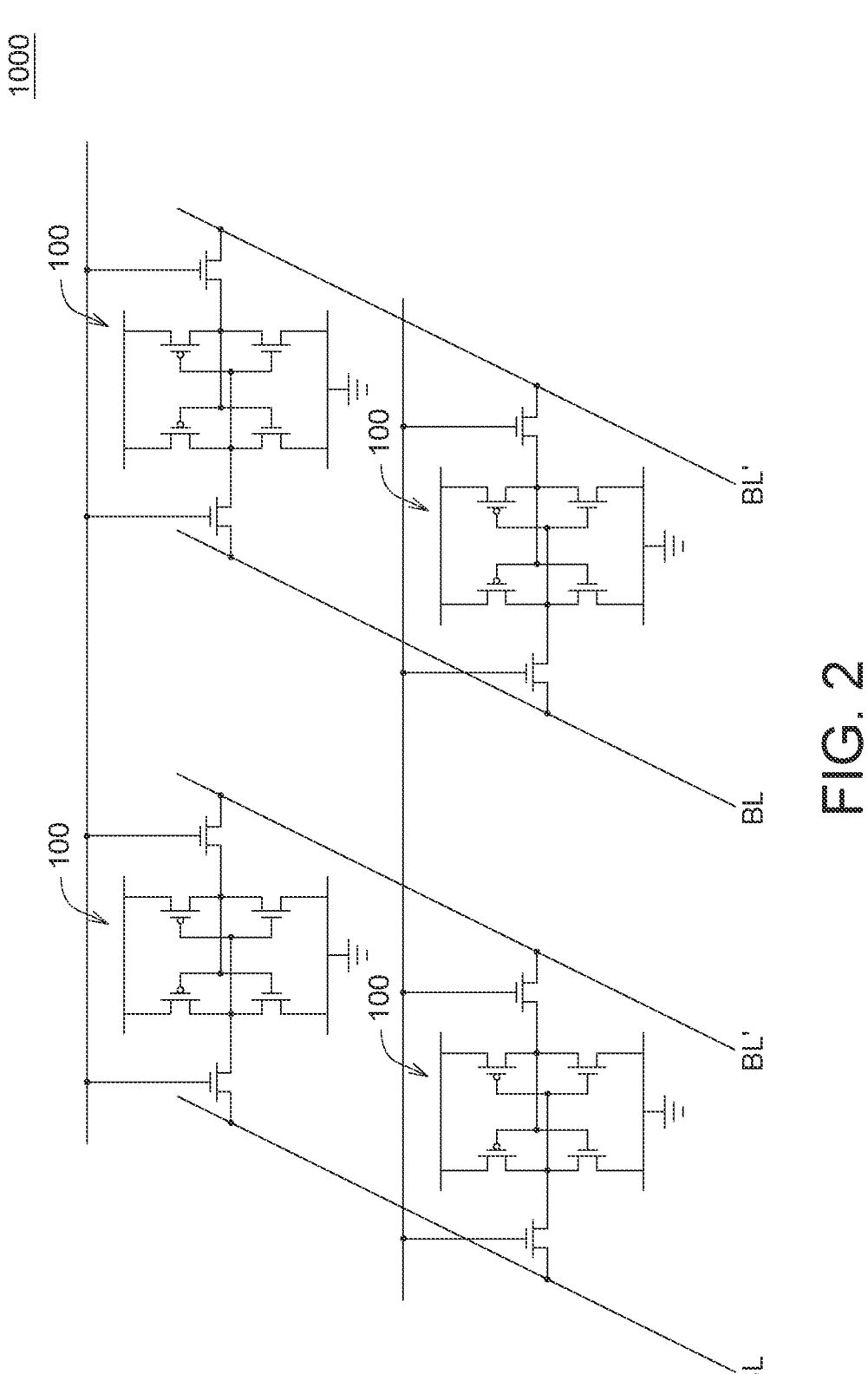
FIG. 2 shows a memory array.

Please refer to FIG. 2, which shows a memory array 1000 Several semiconductor devices 100 can be arranged in an array. The semiconductor devices 100 are connected via the bit line BL and the bit line BL'. Because the length of the bit line BL and the length of the bit line BL' are very long, the resistivity of the bit line BL and the bit line BL' must be low enough for electrical performance. For preventing from increasing the resistivity, the width of the bit line BL and the width of the bit line BL' cannot be too small.

Figure 3:
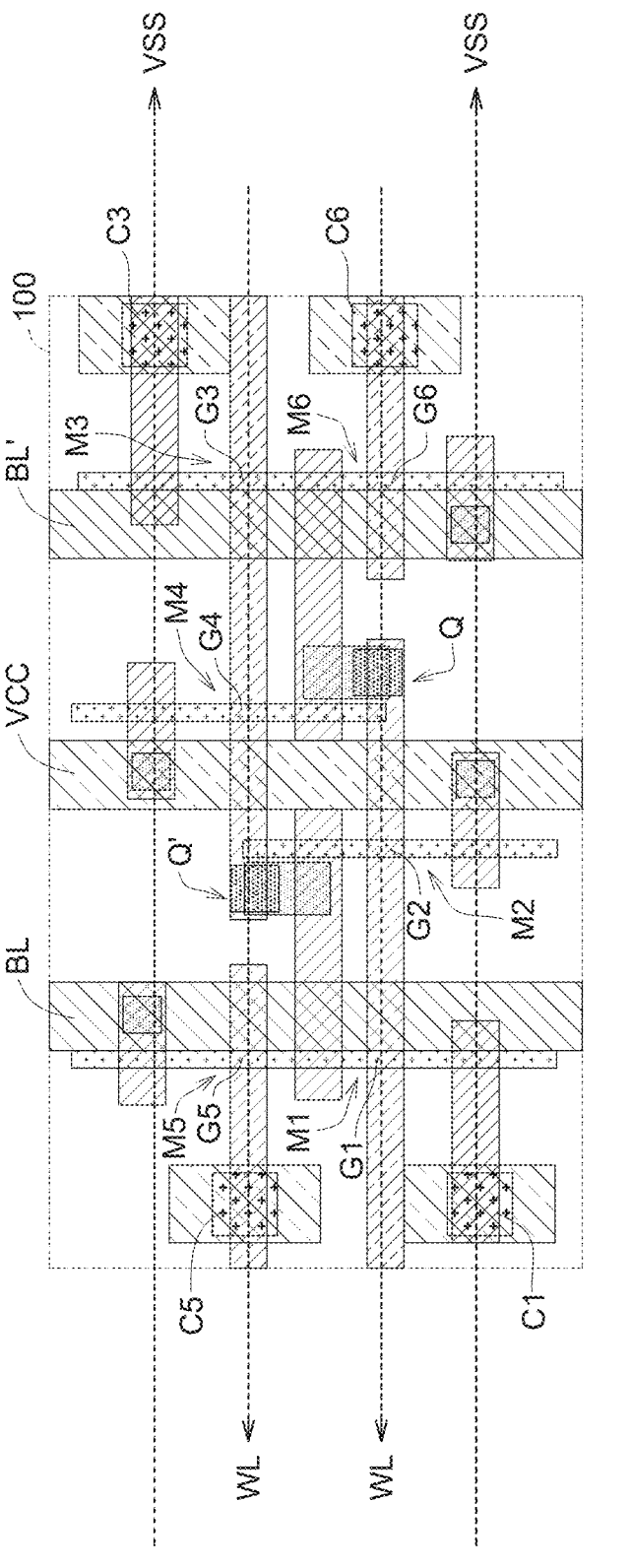
FIG. 3 shows a layout diagram of the semiconductor device.

Please refer to FIG. 3, which shows a layout diagram of the semiconductor device 100. As shown in FIG. 3, the bit line BL, the voltage supply line VCC and the bit line BL' are, for example, three metal lines which are substantially parallel. The voltage supply line VCC is located between the bit line BL and the bit line BL'. The node butted contact Q' is located between the bit line BL and the voltage supply line VCC, and the node butted contact Q is located between the voltage supply line VCC and the bit line BL'. A gate G4 of the pull-up transistor M4 and a gate G3 of the pull-down transistor M3 are connected to the node butted contact Q'. A gate G1 of the pull-down transistor M1 and a gate G12 of the pull-down transistor M1 and the pull-up transistor M2 are connected to the node butted contact Q. A gate G5 of the pass gate transistor M5 is connected to the word line WL via a gate contact C5. A gate G6 of the pass gate transistor M6 is connected to the word line WL via a gate contact C6. A source/drain of the pull-down transistor M3 is connected to a common voltage line VSS via a source/drain contact C3. A source/drain of the pull-down transistor M1 is connected to the common voltage line VSS via a source/drain contact C1. The common voltage line VSS is, for example, connected to a ground end.

For preventing from increasing the resistivity, the width of the bit line BL and the width of the bit line BL' cannot be too small. In this embodiment, the bit line BL, the voltage supply line VCC and the bit line BL' are formed via different masks. That is to say, the bit line BL, the voltage supply line VCC and the bit line BL' are different color metal lines. The process for forming the bit line BL, the voltage supply line VCC and the bit line BL' is illustrated as follows.

Figure 4:
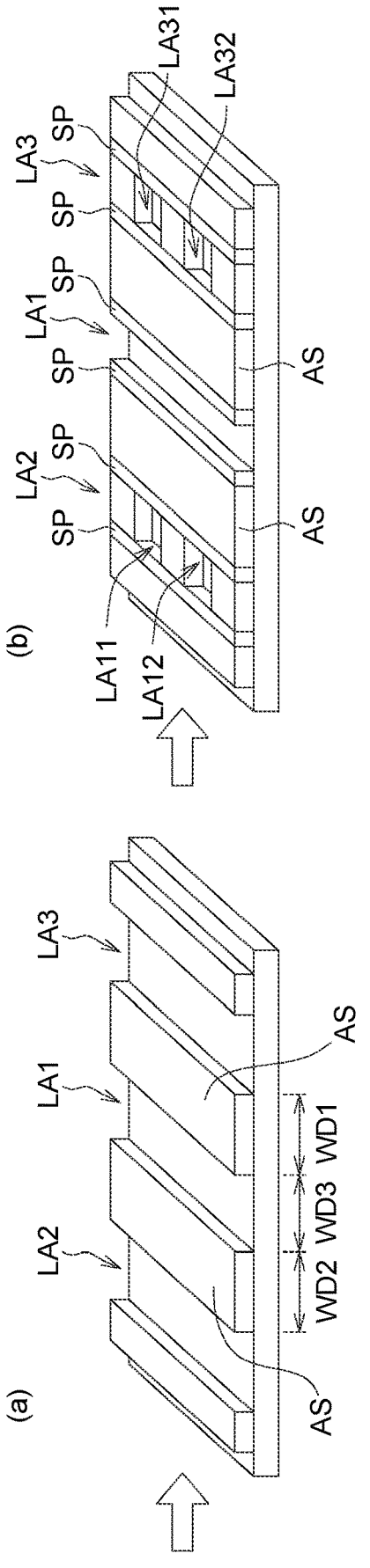
FIG. 4 illustrates some steps of the manufacturing method of the semiconductor device.
Figure 4:
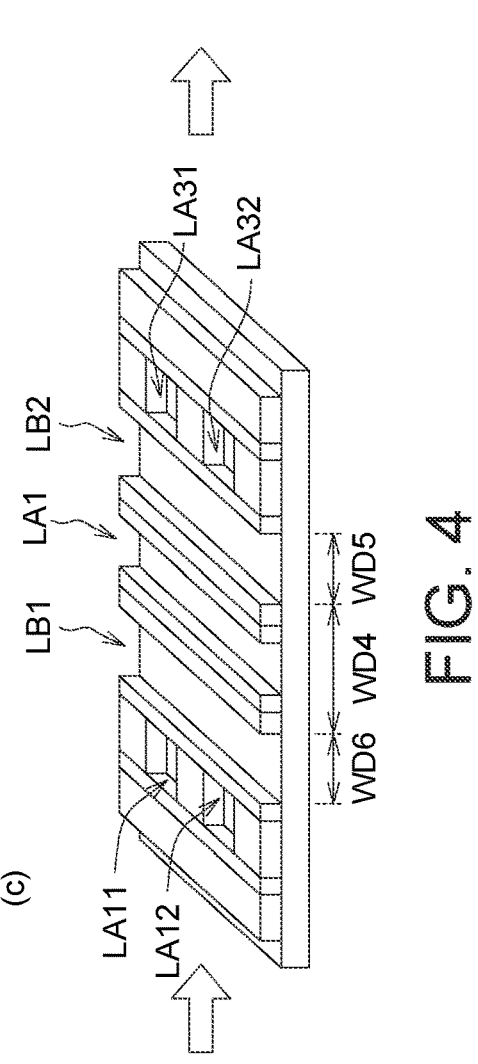

Please refer to FIG. 4, which illustrates some steps of the manufacturing method of the semiconductor device 100. As shown in the drawing (a) of FIG. 4, at least one first metal defining area, such as the first metal defining area LA1, the first metal defining area LA2 and the first metal defining area LA3, is/are patterned. The first metal defining area LA1, the first metal defining area LA2 and the first metal defining area LA3 are strip shaped. The first metal defining area LA1 is used for forming the voltage supply line VCC (shown in FIG. 3). The width WD3 of the first metal defining area LA1 is larger than the width (not shown) of the voltage supply line VCC.

For example, this step illustrated in the drawing (a) of FIG. 4 includes, but not limited thereto, the following processes. A photoresist layer (not shown) is coated on an amorphous silicon layer AS. Then, the photoresist layer is exposed via a mask (not shown) and part of the photoresist layer is remained to form some openings. Afterwards, the amorphous silicon layer AS is etched through the openings in the patterned photoresist layer. Because this step is only used to pattern the first metal defining area LA1, the patterned photoresist layer could cover some areas other than first metal defining area LA1. Therefore, each of the widths WD1, WD2 of the patterned photoresist layer is large enough without dumping. In the case that the patterned photoresist layer will not be dumped, the width WD3 of the first metal defining area LA1 can be enlarged. As such, the voltage supply line VCC form in the first metal defining area LA1 could have large width and have low resistance.

Next, as shown in the drawing (b) in FIG. 4, two spacers SP are formed at two edges of the first metal defining area LA1, two spacers SP are formed at two edges of the first metal defining area LA2, and two spacers SP are formed at two edges of the first metal defining area LA3. As shown in the drawing (b), two contact metal defining areas LA11, LA12 are patterned in the first metal defining area LA1, and two contact metal defining areas LA31, LA32 are patterned in the first metal defining area LA3. The contact metal defining areas LA11 is used to form the gate contact C5 (shown in FIG. 3), the contact metal defining areas LA12 is used to form the source/drain contact C1 (shown in FIG. 3), the contact metal defining areas LA31 is used to form the source/drain contact C3 (shown in FIG. 3), and the contact metal defining areas LA32 is used to form the gate contact C6 (shown in FIG. 3).

Afterwards, as shown in the drawing (c) of FIG. 4, two second metal defining areas LB1, LB2 are patterned for forming the bit line BL and the bit line BL'. The second metal defining areas LB1, LB2 are strip shaped.

For example, this step illustrated in the drawing (c) of FIG. 4 includes, but not limited thereto, the following processes A photoresist layer (not shown) is coated on the remained amorphous silicon layer AS. Then, the photoresist layer is exposed via another mask (not shown) and part of the photoresist layer is remained to form two openings. Afterwards, the remained amorphous silicon layer AS is etched through the openings in the patterned photoresist layer. Because this step is only used to pattern the second metal defining area LB1 and the second metal defining area LB2, the patterned photoresist layer could cover some areas other than the second metal defining area LB1 and the second metal defining area LB2. Therefore, the width WD4 of the patterned photoresist layer is large enough without dumping. In the case that the patterned photoresist layer will not be dumped, the width WD5 of the second metal defining area LB1 and the width WD6 of the second metal defining area LB2 can be enlarged. As such, the bit line BL and the bit line BL' respectively form in the second metal defining area LB1 and the second metal defining area LB2 could have large width and have low resistance.

As shown in the drawing (c) of FIG. 4, the first metal defining area LA1 is located between the second metal defining area LB1 and the second metal defining area LB2. Because the first metal defining area LA1 is already patterned, the photoresist layer for patterning the second metal defining area LB1 and the second metal defining area LB2 could cover the first metal defining area LB1. The width WD4 of the pattern photoresist layer is larger than the width WD3 (shown in the drawing (a) of FIG. 4) of the first metal defining area LA1.

After patterning the first metal defining areas LA1, LA2, LA3 and the second metal defining areas LB1, LB2, metal material is filled in the first metal defining areas LA1, LA2, LA3 and the second metal defining areas LB1, LB2 to form the voltage supply line VCC, the gate contact C5, the source/drain contact C1, the source/drain contact C3, the gate contact C6, the bit line BL and the bit line BL'.

According to the manufacturing method described above, the step of patterning the first metal defining area LA1 and the step of patterning the two second metal defining areas LB1, LB2 are performed at different times, so that the first metal defining area LA1 could have a large width WD3 and each of the second metal defining area LB1 and the second metal defining area LB2 could have large width WD5, WD6. As such, the voltage supply line VCC form in the first metal defining area LA1 could have large width and have low resistance, and the bit line BL and the bit line BL' respectively form in the second metal defining area LB1 and the second metal defining area LB2 could have large width and have low resistance.

On the other hand, according to the manufacturing method described above, the first metal defining area LA1, the second metal defining area LB1 and the second metal defining area LB2 are patterned via two different masks, so that the first metal defining area LA1 could have large width WD3 and each of the second metal defining area LB1 and the second metal defining area LB2 could have large width WD5, WD6. As such, the voltage supply line VCC form in the first metal defining area LA1 could have large width and have low resistance, and the bit line BL and the bit line BL' respectively form in the second metal defining area LB1 and the second metal defining area LB2 could have large width and have low resistance.

Moreover, according to the manufacturing method described above, the first metal defining area LA1 for forming the voltage supply line VCC is patterned first, and then the two second metal defining areas LB1, LB2 are patterned at two sides of the first metal defining area LA1 for forming the two bit lines BL, BL', so that the first metal defining area LA1 could have large width WD3 and each of the second metal defining area LB1 and the second metal defining area LB2 could have large width WD5, WD6. As such, the voltage supply line VCC form in the first metal defining area LA1 could have large width and have low resistance, and the bit line BL and the bit line BL' respectively form in the second metal defining area LB1 and the second metal defining area LB2 could have large width and have low resistance.

Further, the semiconductor device 100 may be manufactured by the EUV double pattern process, the bit lines BL, BL' and the voltage supply line VCC patterned as different color metal lines overcome space limit as advanced technology scaling. The manufacturing method described above could be applied to the FinFET or the Stacked Nanosheet transistor to reach high-speed memory cells performance. Moreover, the bit lines BL, BL' benefit for RC tunable as advanced technology scaling.

Figure 5A:
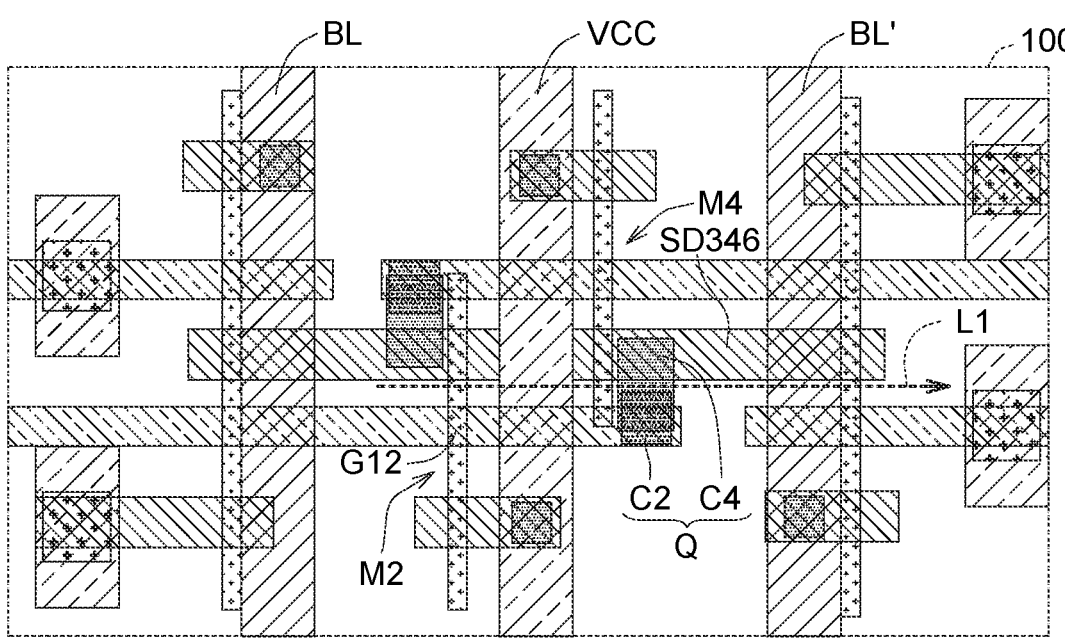
FIG. 5A shows the layout diagram of the semiconductor device.

Please refer to FIG. 5A, which shows the layout diagram of the semiconductor device 100. A cross section line L1 crosses from the voltage supply line VCC, the node butted contact Q and the bit line BL'. The node butted contact Q is composed of a gate contact C2 and a source/drain contact C4. In the example shown in FIG. 5, the source/drain contact C4 is larger than the gate contact C2. The source/drain contact C4 overlaps part of the gate G12 of the pull-down transistor M1 and the pull-up transistor M2. The gate contact C2 does not overlap the source/drain SD346 of the pull-down transistor M3, the pull-up transistor M4 and the pass-gate transistor M6.

Figure 5B:
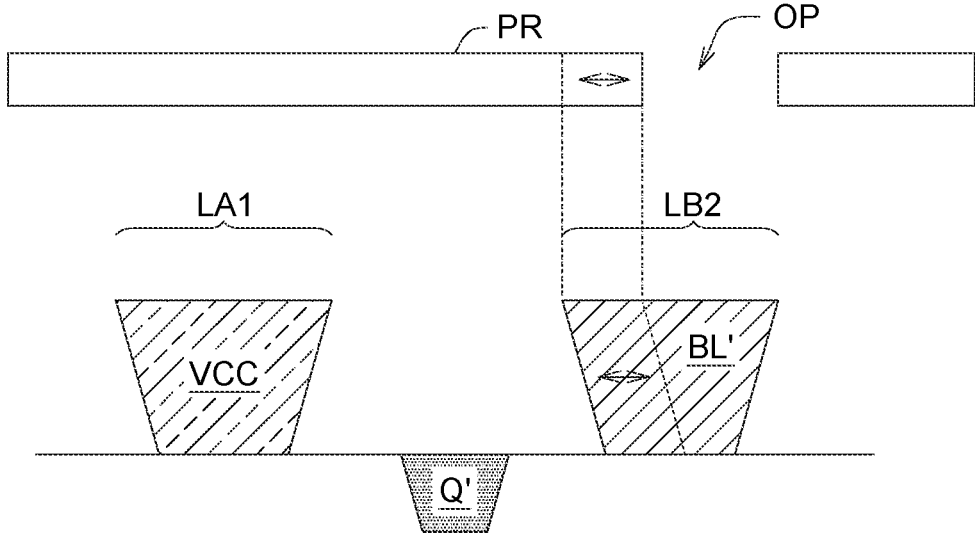
FIG. 5B show a cross section view of the semiconductor device along the cross section line L1.

Please refer to FIG. 5B, which show a cross section view of the semiconductor device 100 along the cross section line L1. As shown in FIG. 5B, the first metal defining area LA1 is patterned before the second metal defining area LB2. The second metal defining area LB2 is tunable by adjusting the opening OP of the photoresist layer PR for well isolating the bit line BL' and the node butted contact Q.

Figure 6:
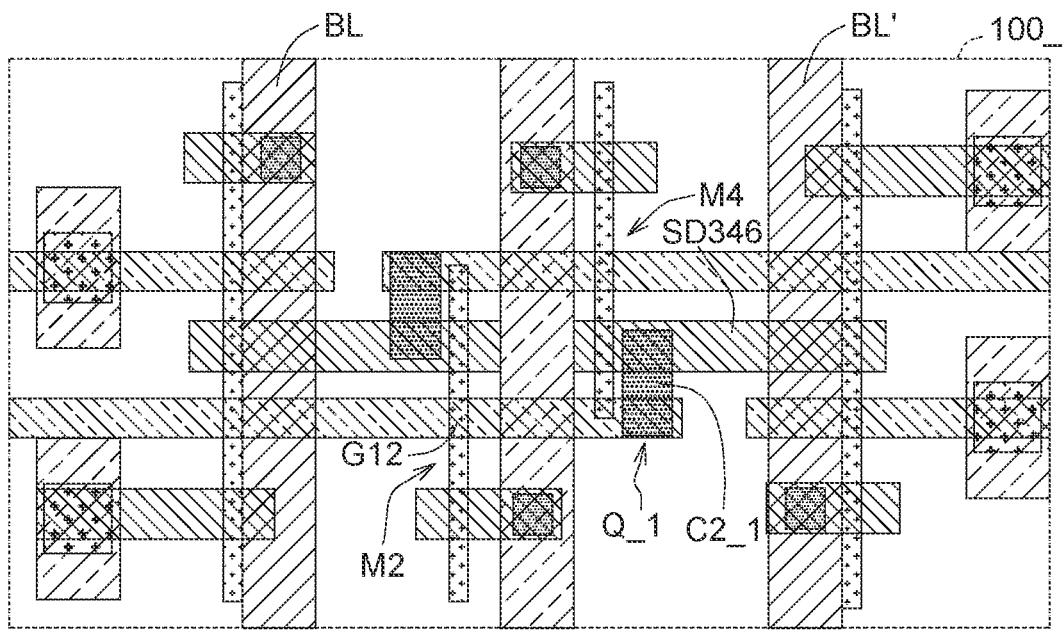
FIG. 6 shows the layout diagram of another semiconductor device.

Please refer to FIG. 6, which shows the layout diagram of another semiconductor device 100_1. Comparing to FIG. 5A, the node butted contact Q_1 in FIG. 6 is composed of a metal contact C2_1 without any source/drain contact. The node butted contact Q_1 is used to connect the input of the first inverter IV1 (shown in FIG. 1) to the output of the second inverter IV2 (shown in FIG. 1). The metal contact C2_1 is directly contacted the gate G12 of the first pull-down transistor M1 and the first pull-up transistor M2. The metal contact C2_1 is also directly contacted the source/drain SD346 of the second pull-down transistor M3, the second pull-up transistor M4 and the second pass gate transistor M6.

The metal contact C2_1 is enlarged and is long slot shaped. The metal contact C2_1 overlaps part of the gate G12 of the pull-down transistor M1 and the pull-up transistor M2 and overlaps part of the source/drain SD346 of the pull-down transistor M3, the pull-up transistor M4 and the pass-gate transistor M6.

As shown in FIG. 6, only part of the metal contact C2_1 overlaps the gate G12 of the first pull-down transistor M1 and the first pull-up transistor M2. Only part of the metal contact C2_1 overlaps the source/drain SD346 of the second pull-down transistor M3, the second pull-up transistor M4 and the second pass gate transistor M6. One end of the metal contact C2_1 is located above a range of the gate of the first pull-down transistor M1 and the first pull-up transistor M2.

As shown in FIG. 6, in one embodiment, an overlapping area of the metal contact C2_1 overlapping the gate G12 of the first pull-down transistor M1 and the first pull-up transistor M2 is, for example, substantially equal to an overlapping area of the metal contact C2_1 overlapping the source/drain SD346 of the second pull-down transistor M3, the second pull-up transistor M4 and the second pass gate transistor M6.

Further, in the embodiment of FIG. 6, a width of the metal contact C2_1 is substantially uniform.

In case of that the node butted contact Q_1 is composed of the metal contact C2_1 without any source/drain contact, the second metal defining area LB2 is tunable for well isolating the bit line BL' and the node butted contact Q_1 also.

Figure 7:
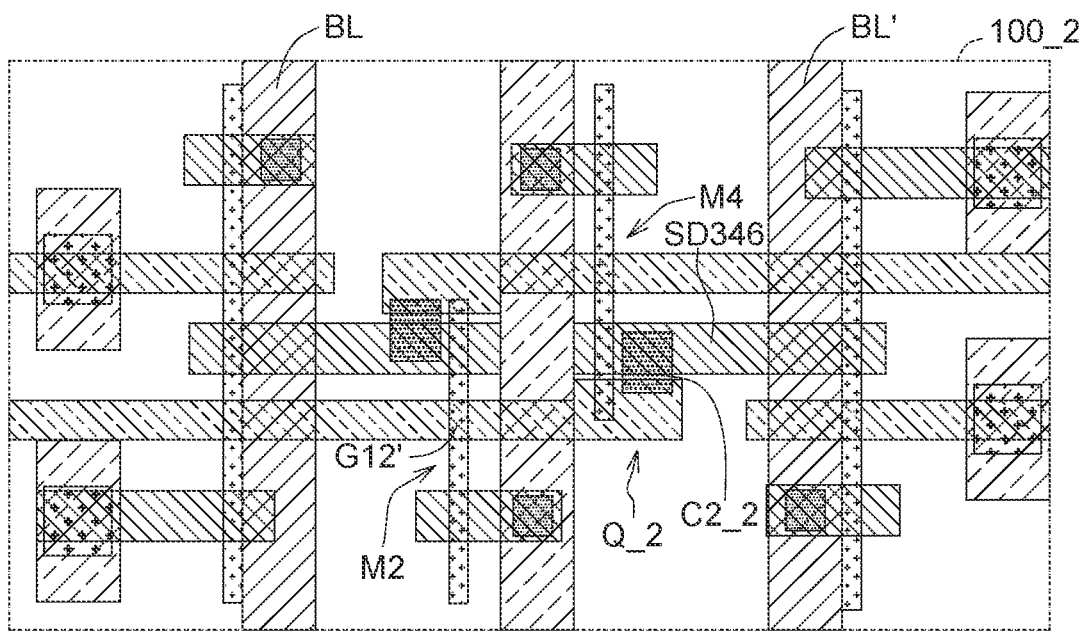
FIG. 7 shows the layout diagram of another semiconductor device.

Please refer to FIG. 7, which shows the layout diagram of another semiconductor device 100_2. Comparing to FIG. 5A, the end of the gate G12 of the pull-down transistor M1 and the pull-up transistor M2 in FIG. 7 is jog shaped and the node butted contact Q_2 in FIG. 7 is composed of a metal contact C2_2 without any source/drain contact. The node butted contact Q_2 is used to connect the input of the first inverter IV1 (shown in FIG. 1) to the output of the second inverter IV2 (shown in FIG. 1). The metal contact C2_2 is directly contacted the gate G12' of the first pull-down transistor M1 and the first pull-up transistor M2. The metal contact C2_2 is also directly contacted the source/drain SD346 of the second pull-down transistor M3, the second pull-up transistor M4 and the second pass gate transistor M6.

In the embodiment of FIG. 7, the gate G12' of the first pull-down transistor M1 and the first pull-up transistor M2 has an enlarged terminal. The enlarged terminal of the gate G12' extends toward the source/drain SD346 of the second pull-down transistor M3, the second pull-up transistor M4 and the second pass gate transistor M6. The enlarged terminal of the gate G12' is 1.1 to 1.5 times as wide as a body of the gate G12'. The enlarged terminal of the gate G12' is located at outside of a voltage supply line VCC.

The metal contact C2_2 overlaps part of the gate G12' of the pull-down transistor M1 and the pull-up transistor M2 and part of the source/drain SD346 of the pull-down transistor M3, the pull-up transistor M4 and the pass-gate transistor M6.

As shown in FIG. 7, only part of the metal contact C2_2 overlaps the gate G12' of the first pull-down transistor M1 and the first pull-up transistor M2. Only part of the metal contact C2_2 overlaps the source/drain SD346 of the second pull-down transistor M3, the second pull-up transistor M4 and the second pass gate transistor M6.

As shown in FIG. 7, in one embodiment, an overlapping area of the metal contact C2_2 overlapping the gate G12' of the first pull-down transistor M1 and the first pull-up transistor M2 is, for example, smaller than an overlapping area of the metal contact C2_2 overlapping the source/drain SD346 of the second pull-down transistor M3, the second pull-up transistor M4 and the second pass gate transistor M6.

In case of that the end of the gate G12 of the pull-down transistor M1 and the pull-up transistor M2 is jog shaped and the node butted contact Q_2 is composed of the metal contact C2_2 without any source/drain contact, the second metal defining area LB2 is tunable for well isolating the bit line BL' and the node butted contact Q_2 also.

Figure 8:
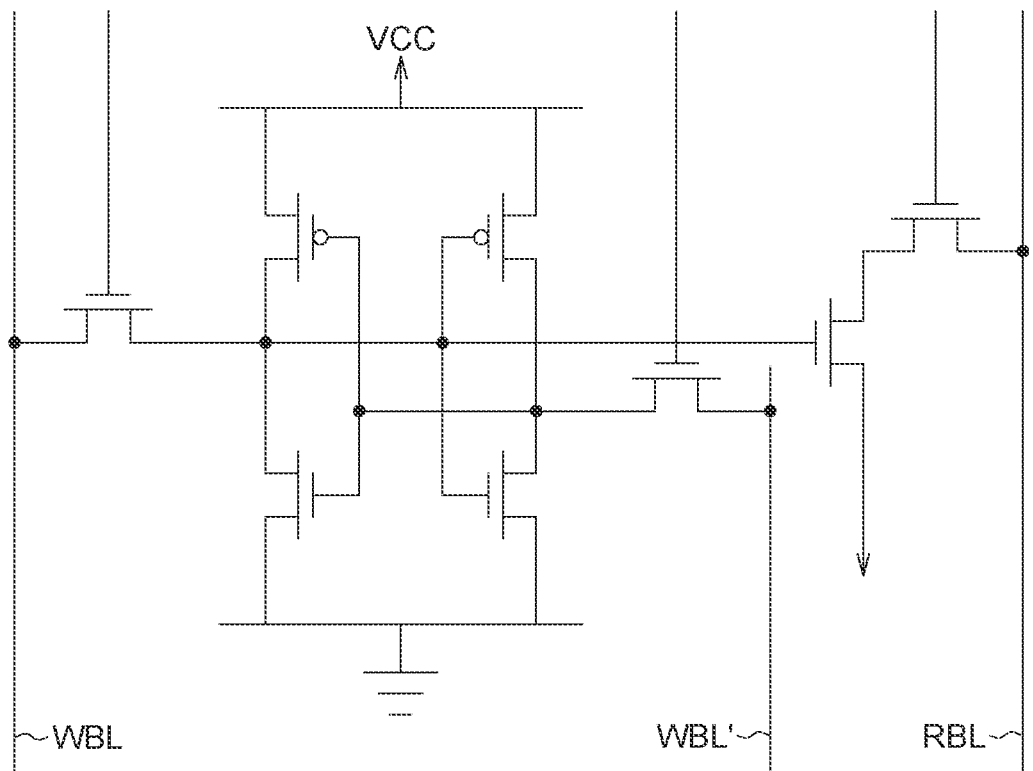
FIG. 8 shows a dual-ports 8 T-SRAM cell.

Base on above, the semiconductor devices 100, 100_1 or 100_2 are exemplified the 6 T-SRAM cell as several examples. In another embodiment, the semiconductor device could be a 8 T-SRAM cell or a 10 T SRAM cell. Please refer to FIG. 8, which shows a dual-ports 8 T-SRAM cell. The metal defining areas for forming the voltage supply line VCC, a first write bit line WBL, a second write bit line WBL' and a read bit line RBL could be patterned at different times. The metal defining areas for forming the voltage supply line VCC, the first write bit line WBL, the second write bit line WBL' and the read bit line RBL could be patterned via different masks.

Figure 9:
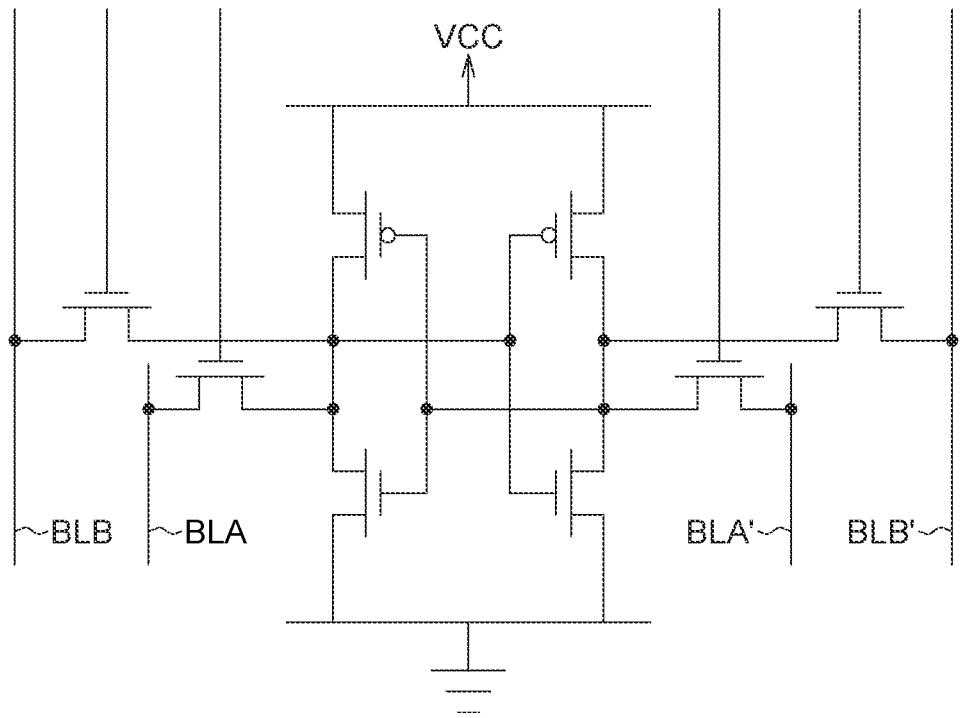
FIG. 9 shows a dual-ports 10 T-SRAM cell.

Please refer to FIG. 9, which shows a dual-ports 10 T-SRAM cell. The metal defining areas for forming the voltage supply line VCC, a first bit line BLA, a second bit line BLA', a third bit line BLB and a fourth bit line BLB' could be patterned at different times. The metal defining areas for forming the voltage supply line VCC, the first bit line BLA, the second bit line BLA', the third bit line BLB and the fourth bit line BLB' could be patterned via different masks.

Figure 10:
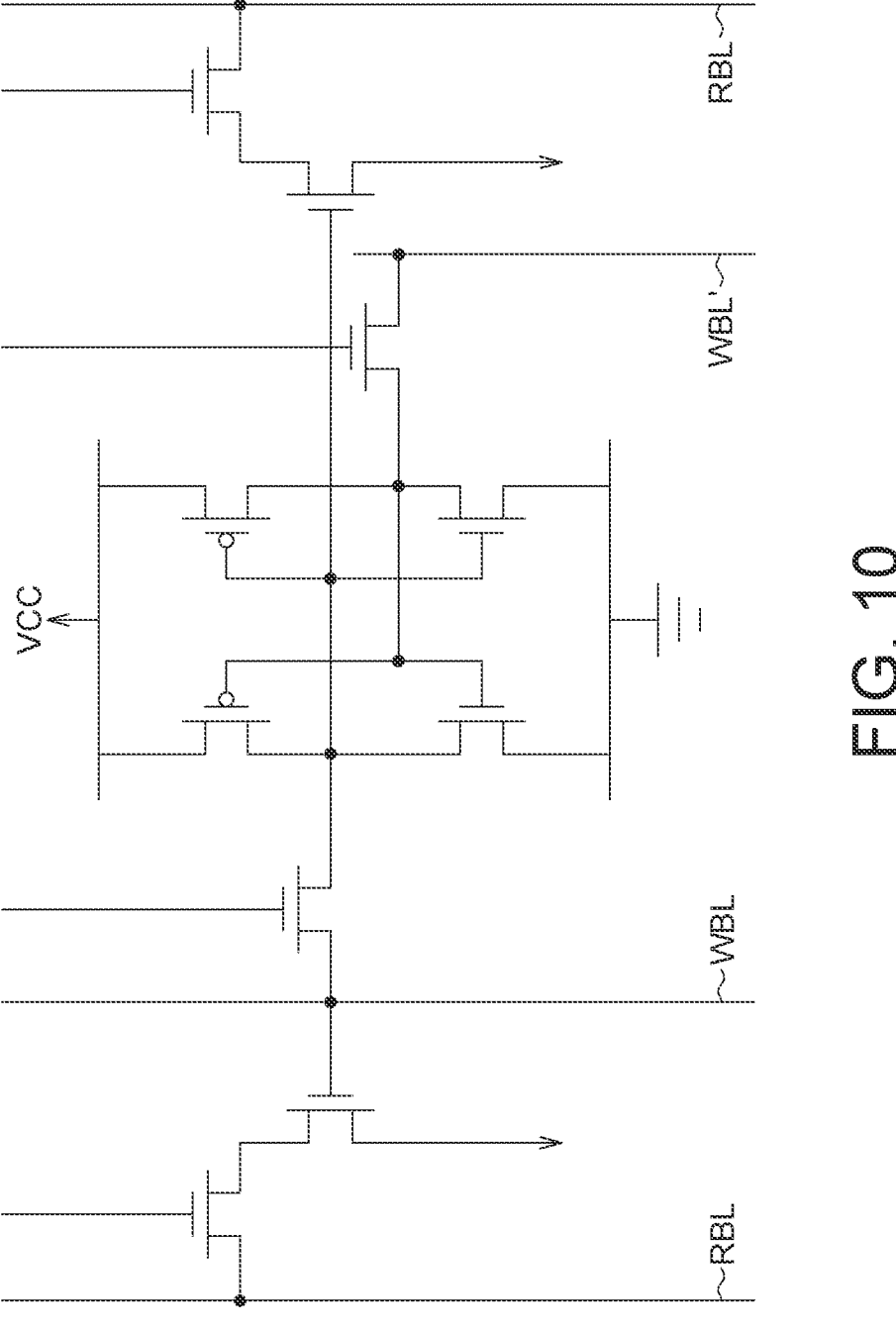
FIG. 10 shows a trial-ports 10 T-SRAM cell.

Please refer to FIG. 10, which shows a trial-ports 10 T-SRAM cell. The metal defining areas for forming the voltage supply line VCC, a first write bit line WBL, a second write bit line WBL' and two read bit line RBL could be patterned at different times. The metal defining areas for forming the voltage supply line VCC, the first write bit line WBL, the second write bit line WBL' and the two read bit line RBL could be patterned via different masks.

Various embodiments or examples described herein offer multiple advantages. Embodiments of the present disclosure provide the manufacturing method for forming at least three metal lines of the semiconductor device. Particularly, the bit lines and the voltage supply line are different color metal line with EUV double patterns process and different designs for the node butted contact. The novel manufacturing method overcomes the space limit in the EUV patterns process as advanced technology scaling.

It will be understood that not all advantages have been necessarily discussed herein, no particular advantage is required for all embodiments or examples, and other embodiments or examples may offer different advantages.

Some embodiments of the present disclosure provide a semiconductor device. The semiconductor includes a first pull-down transistor, a first pull-up transistor, a second pull-down transistor, a second pull-up transistor, a first pass gate transistor, a second pass gate transistor, a first bit line, a second bit line, a word line and a voltage supply line. The first pull-down transistor and the first pull-up transistor form a first inverter. The second pull-down transistor and the second pull-up transistor form a second inverter. An input of the first inverter is connected to an output of the second inverter through a first node butted contact. An output of the first inverter is connected to an input of the second inverter through a second node butted contact. The first pass gate transistor is connected to the second node butted contact. The second pass gate transistor is connected to the first node butted contact. The first bit line is connected to the first pass gate transistor. The second bit line is connected to the second pass gate transistor. The word line is connected to the first pass gate transistor and the second pass gate transistor. The voltage supply line is connected to the first pull-up transistor and the second pull up transistor. The first node butted contact includes a metal contact overlapping a gate of the first pull-down transistor and the first pull-up transistor and overlapping a source/drain of the second pull-down transistor, the second pull-up transistor and the second pass gate transistor.

Some embodiments of the present disclosure provide a semiconductor device. The semiconductor device includes a first pull-down transistor, a first pull-up transistor, a second pull-down transistor, a second pull-up transistor, a first pass gate transistor, a second pass gate transistor, a first bit line, a second bit line, a word line and a voltage supply line. The first pull-down transistor and the first pull-up transistor form a first inverter. The second pull-down transistor and the second pull-up transistor form a second inverter. An input of the first inverter is connected to an output of the second inverter through a first node butted contact and an output of the first inverter is connected to an input of the second inverter through a second node butted contact. The first pass gate transistor is connected to the second node butted contact. The second pass gate transistor is connected to the first node butted contact. The first bit line is connected to the first pass gate transistor. The second bit line is connected to the second pass gate transistor. The word line is connected to the first pass gate transistor and the second pass gate transistor. The voltage supply line is connected to the first pull-up transistor and the second pull up transistor. The first node butted contact includes a metal contact connected to a gate of the first pull-down transistor and the first pull-up transistor and connected to a source/drain of the second pull-down transistor, the second pull-up transistor and the second pass gate transistor. The gate of the first pull-down transistor and the first pull-up transistor has an enlarged terminal.

Some embodiments of the present disclosure provide a semiconductor device is provided. The semiconductor device includes a first pull-down transistor, a first pull-up transistor, a second pull-down transistor, a second pull-up transistor, a first pass gate transistor, a second pass gate transistor, a first bit line, a second bit line, a word line and a voltage supply line. The first pull-down transistor and the first pull-up transistor form a first inverter. The second pull-down transistor and the second pull-up transistor form a second inverter. An input of the first inverter is connected to an output of the second inverter through a first node butted contact. An output of the first inverter is connected to an input of the second inverter through a second node butted contact. The first pass gate transistor is connected to the second node butted contact. The second pass gate transistor is connected to the first node butted contact. The first bit line is connected to the first pass gate transistor. The second bit line is connected to the second pass gate transistor. The word line is connected to the first pass gate transistor and the second pass gate transistor. The voltage supply line is connected to the first pull-up transistor and the second pull up transistor. The first node butted contact includes a metal contact directly contacted a gate of the first pull-down transistor and the first pull-up transistor and directly contacted a source/drain of the second pull-down transistor, the second pull-up transistor and the second pass gate transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first pull-down transistor;
   a first pull-up transistor, wherein the first pull-down transistor and the first pull-up transistor form a first inverter;
   a second pull-down transistor;
   a second pull-up transistor, wherein the second pull-down transistor and the second pull-up transistor form a second inverter, an input of the first inverter is connected to an output of the second inverter through a first node butted contact, and an output of the first inverter is connected to an input of the second inverter through a second node butted contact;
   a first pass gate transistor, connected to the second node butted contact;

a second pass gate transistor, connected to the first node butted contact;

a first bit line, connected to the first pass gate transistor;

a second bit line, connected to the second pass gate transistor;

a word line, connected to the first pass gate transistor and the second pass gate transistor; and a voltage supply line, connected to the first pull-up transistor and the second pull up transistor;

wherein the first node butted contact includes a metal contact overlapping a gate of the first pull-down transistor and the first pull-up transistor and overlapping a source/drain of the second pull-down transistor, the second pull-up transistor and the second pass gate transistor, and the gate of the first pull-down transistor and the first pull-up transistor is substantially parallel to the source/drain of the second pull-down transistor, the second pull-up transistor and the second pass gate transistor.

2. The semiconductor device according to claim 1, wherein the metal contact directly contacts the gate of the first pull-down transistor and the first pull-up transistor and directly contacts the source/drain of the second pull-down transistor, the second pull-up transistor and the second pass gate transistor.

3. The semiconductor device according to claim 1, wherein an overlapping area of the metal contact overlapping the gate of the first pull-down transistor and the first pull-up transistor is substantially equal to an overlapping area of the metal contact overlapping the source/drain of the second pull-down transistor, the second pull-up transistor and the second pass gate transistor.

4. The semiconductor device according to claim 1, wherein a width of the metal contact is substantially uniform.

5. The semiconductor device according to claim 1, wherein only part of the metal contact overlaps the gate of the first pull-down transistor and the first pull-up transistor.

6. The semiconductor device according to claim 1, wherein only part of the metal contact overlaps the source/drain of the second pull-down transistor, the second pull-up transistor and the second pass gate transistor.

7. The semiconductor device according to claim 1, wherein the metal contact is long slot shaped.

8. The semiconductor device according to claim 7, wherein one end of the metal contact is located above the gate of the first pull-down transistor and the first pull-up transistor.

9. The semiconductor device according to claim 7, wherein one end of the metal contact is located above the source/drain of the second pull-down transistor, the second pull-up transistor and the second pass gate transistor.

10. A semiconductor device, comprising:

a first pull-down transistor;

a first pull-up transistor, wherein the first pull-down transistor and the first pull-up transistor form a first inverter;

a second pull-down transistor;

a second pull-up transistor, wherein the second pull-down transistor and the second pull-up transistor form a second inverter, an input of the first inverter is connected to an output of the second inverter through a first node butted contact and an output of the first inverter is connected to an input of the second inverter through a second node butted contact;

a first pass gate transistor, connected to the second node butted contact;

a second pass gate transistor, connected to the first node butted contact;

a first bit line, connected to the first pass gate transistor;

a second bit line, connected to the second pass gate transistor;

a word line, connected to the first pass gate transistor and the second pass gate transistor; and a voltage supply line, connected to the first pull-up transistor and the second pull up transistor;

wherein the first node butted contact includes a metal contact connected to a gate of the first pull-down transistor and the first pull-up transistor and connected to a source/drain of the second pull-down transistor, the second pull-up transistor and the second pass gate transistor, and the gate of the first pull-down transistor and the first pull-up transistor has an enlarged terminal, and the gate of the first pull-down transistor and the first pull-up transistor is substantially parallel to the source/drain of the second pull-down transistor, the second pull-up transistor and the second pass gate transistor.

11. The semiconductor device according to claim 10, wherein the enlarged terminal of the gate is 1.1 to 1.5 times as wide as a body of the gate.

12. The semiconductor device according to claim 10, wherein the enlarged terminal of the gate is located at outside of a voltage supply line.

13. The semiconductor device according to claim 10, wherein the metal contact directly contacts the gate of the first pull-down transistor and the first pull-up transistor and directly contacts the source/drain of the second pull-down transistor, the second pull-up transistor and the second pass gate transistor.

14. The semiconductor device according to claim 10, wherein an overlapping area of the metal contact overlapping the gate of the first pull-down transistor and the first pull-up transistor is smaller than an overlapping area of the metal contact overlapping the source/drain of the second pull-down transistor, the second pull-up transistor and the second pass gate transistor.

15. The semiconductor device according to claim 10, wherein only part of the metal contact overlaps the gate of the first pull-down transistor and the first pull-up transistor.

16. The semiconductor device according to claim 10, wherein only part of the metal contact overlaps the source/drain of the second pull-down transistor, the second pull-up transistor and the second pass gate transistor.

17. A semiconductor device, comprising:

a first pull-down transistor;

a first pull-up transistor, wherein the first pull-down transistor and the first pull-up transistor form a first inverter;

a second pull-down transistor;

a second pull-up transistor, wherein the second pull-down transistor and the second pull-up transistor form a second inverter, an input of the first inverter is connected to an output of the second inverter through a first node butted contact, and an output of the first inverter is connected to an input of the second inverter through a second node butted contact;

a first pass gate transistor, connected to the second node butted contact;

a second pass gate transistor, connected to the first node butted contact;

a first bit line, connected to the first pass gate transistor;

a second bit line, connected to the second pass gate transistor;

a word line, connected to the first pass gate transistor and the second pass gate transistor; and a voltage supply line, connected to the first pull-up transistor and the second pull up transistor;

wherein the first node butted contact includes a metal contact directly contacting a gate of the first pull-down transistor and the first pull-up transistor and directly contacting a source/drain of the second pull-down transistor, the second pull-up transistor and the second pass gate transistor, and the gate of the first pull-down transistor and the first pull-up transistor is substantially parallel to the source/drain of the second pull-down transistor, the second pull-up transistor and the second pass gate transistor.

18. The semiconductor device according to claim 17, wherein only part of the metal contact overlaps the gate of the first pull-down transistor and the first pull-up transistor.

19. The semiconductor device according to claim 17, wherein only part of the metal contact overlaps the source/drain of the second pull-down transistor, the second pull-up transistor and the second pass gate transistor.

20. The semiconductor device according to claim 17, wherein one end of the metal contact is located above the gate of the first pull-down transistor and the first pull-up transistor.

\* \* \* \* \*